(12) United States Patent
Kang et al.

(10) Patent No.: US 9,012,909 B2
(45) Date of Patent: Apr. 21, 2015

(54) OXIDE SEMICONDUCTOR, OXIDE SEMICONDUCTOR THIN FILM, AND THIN FILM TRANSISTOR INCLUDING THE SAME

(71) Applicant: Samsung Display Co., Ltd., Yongin (KR)

(72) Inventors: IL-Joon Kang, Yongin (KR); Young-Mi Cho, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/096,741

(22) Filed: Dec. 4, 2013

(65) Prior Publication Data

US 2014/0374741 A1    Dec. 25, 2014

(30) Foreign Application Priority Data

Jun. 21, 2013  (KR) .................. 10-2013-0071949

(51) Int. Cl.
*H01L 29/10*    (2006.01)
*H01L 29/786*   (2006.01)

(52) U.S. Cl.
CPC .................. *H01L 29/7869* (2013.01)

(58) Field of Classification Search
CPC .......................... H01L 29/7869; H01L 21/16
USPC ............................................. 257/43; 438/104
See application file for complete search history.

(56) References Cited

U.S. PATENT DOCUMENTS

| 7,906,777 | B2 | 3/2011 | Yano et al. |
| 2006/0220023 | A1* | 10/2006 | Hoffman et al. ............. 257/72 |
| 2012/0025148 | A1 | 2/2012 | Uchiyama et al. |
| 2012/0049181 | A1 | 3/2012 | Kim et al. |
| 2013/0122666 | A1 | 5/2013 | Yamazaki et al. |
| 2013/0161602 | A1* | 6/2013 | James et al. ................. 257/40 |

FOREIGN PATENT DOCUMENTS

| KR | 10-2010-0051550 | 5/2010 |
| KR | 10-2012-0019740 | 3/2012 |
| KR | 10-2012-0022525 | 3/2012 |
| KR | 10-2012-0064256 | 6/2012 |

* cited by examiner

*Primary Examiner* — Jami M Valentine
(74) *Attorney, Agent, or Firm* — H.C. Park & Associates, PLC (57) ABSTRACT

An oxide semiconductor includes zinc (Zn), tin (Sn), and at least one of Ag and Au.

23 Claims, 6 Drawing Sheets

OXIDE SEMICONDUCTOR, OXIDE SEMICONDUCTOR THIN FILM, AND THIN FILM TRANSISTOR INCLUDING THE SAME

CROSS-REFERENCE TO RELATED APPLICATION

This application claims priority from and the benefit of Korean Patent Application No. 10-2013-0071949, filed on Jun. 21, 2013, which is incorporated by reference for all purposes as if set forth herein.

BACKGROUND

1. Field

Exemplary embodiments relate to an oxide semiconductor, an oxide semiconductor thin film, and a thin film transistor including the same, and, more particularly, to an oxide semiconductor including zinc and tin, an oxide semiconductor thin film including zinc and tin, and a thin film transistor including the same.

2. Discussion

Oxide semiconductors typically exhibit greater electron mobility than amorphous silicon semiconductors. To this end, low temperature processes are usually easier to perform with oxide semiconductors than with polycrystalline silicon semiconductors. In addition, oxide semiconductors are generally transparent with respect to visible light, and, as such, numerous electronic devices, such as thin film transistors, utilize oxide semiconductors.

Indium (In) ions in various oxide semiconductors, such as, for example, indium oxide ($In_2O_3$) semiconductors, zinc indium oxide (Zn—In—O) semiconductors, indium gallium oxide (In—Ga—O) semiconductors, indium zinc oxide (In—Zn—O) semiconductors, indium gallium zinc oxide (In—Ga—Zn—O) semiconductors, etc., typically exhibit an electron distribution in the outermost and 5s orbital that are considered to influence (e.g., increase) electron mobility of such oxide semiconductors. It is noted, however, that since oxide semiconductors typically use rare earth metals (e.g., indium (In)), the cost of oxide semiconductors including indium is relatively higher than other forms of semiconductors.

Zinc tin oxide (Zn—Sn—O) semiconductors use tin (Sn), which is relatively abundant on the earth, and, as such, typically cost less than oxide semiconductors including rare earth metals. To this end, Zn—Sn—O semiconductors may exhibit better reliability than oxide semiconductors including indium. It is noted, however, that Zn—Sn—O semiconductors may exhibit lower electron mobility than oxide semiconductors including indium. Therefore, a need exists for Zn—Sn—O semiconductors with higher electron mobility.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a Zn—Sn—O semiconductor thin film having relatively high electron mobility.

Exemplary embodiments provide a thin film transistor including a Zn—Sn—O semiconductor having relatively high electron mobility.

Additional aspects will be set forth in the detailed description which follows and, in part, will be apparent from the disclosure, or may be learned by practice of the inventive concept.

According to exemplary embodiments, an oxide semiconductor includes zinc (Zn), tin (Sn), and at least one element (M) among Ag and Au.

According to exemplary embodiments, a thin film includes zinc (Zn), tin (Sn), and at least one element (M) among Ag and Au.

According to exemplary embodiments, a thin film transistor includes a gate electrode disposed on a substrate, a gate insulating layer disposed on the substrate, a semiconductor layer disposed on the substrate, the gate insulating layer being configured to insulate the semiconductor layer and the gate electrode from one another, a source electrode disposed on the substrate, and a drain electrode disposed on the substrate. The semiconductor layer includes zinc (Zn), tin (Sn), and at least one element (M) among Ag and Au.

According to exemplary embodiments, use of Ag and/or Au in Zn—Sn—O may increase the electron mobility of a resulting composition. To this end, the use of Ag and/or Au in a Zn—Sn—O semiconductor layer of a thin film transistor may increase the electron mobility of the thin film transistor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and together with the description serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

According to exemplary embodiments, an oxide semiconductor may include zinc (Zn), tin (Sn), and at least one of silver (Ag) and gold (Au). That is, an oxide semiconductor may include a Zn—Sn—Ag—O, Zn—Sn—Au—O, or Zn—Sn—Ag—Au—O composition. In this manner, the oxide semiconductor may be transparent with respect to visible light. For descriptive purposes, element M may be utilized to refer to Ag, Au, or Ag and Au. It is noted, however, that the oxide semiconductor may include one or more other constituent components.

In exemplary embodiments, an atomic ratio of element M to all metal elements (e.g., Zn+Sn+M) of the oxide semiconductor, e.g., M/(Zn+Sn+M), may be in a range from about 1 to about 16 atomic percent (at %), such as in a range from about 1 to about 4 at %, e.g., from about 2 to about 5 at %. The atomic ratio of Zn to Sn, e.g., Zn:Sn, in the oxide semiconductor may be in a range from about 1:1 to about 2:1. In addition, the atomic ratio of oxygen to Sn, e.g., O:Sn, may be in a range from about 4:1 to about 3.75:1.

According to exemplary embodiments, the electron mobility of a Zn—Sn—Ag—O or Zn—Sn—Au—O oxide semiconductor may be in a range of about 9 to about 10 $cm^2/V \cdot s$, such as about 9.3 to about 9.7 $cm^2/V \cdot s$, e.g., about 9.4 to about 9.6 $cm^2/V \cdot s$. When the Ag or the Au of the oxide semiconductor is provided in the above-described atomic ratio quantities, the electron mobility of the oxide semiconductor may be increased. Since Ag and Au (either alone or in an oxidized state) have similar electron distributions in their 5s and/or 6s orbitals as indium (In), utilization of Ag or Au may provide similar operational characteristics as when In is utilized. It is contemplated, however, that any other suitable element (either alone or in an oxidized state) with similar electron distributions in its 5s and/or 6s orbitals as In may be utilized. To this end, the oxide semiconductor may be configuration as an n-type semiconductor.

The electron mobility of an oxide semiconductor may be inversely proportional to the effective mass of electrons of the oxide semiconductor, and may be defined as in Equation 1, provided below.

$$\mu = \frac{<\tau>}{m^*} \qquad \text{Equation 1}$$

It is noted that $\mu$ is the electron mobility, $m^*$ is the effective mass of electrons, and $<\tau>$ is a proportional constant related to the average scattering time of electrons. In exemplary embodiments, the effective mass of the electrons of the oxide semiconductor may be in a range from about $0.220\ m_0$ to about $0.244\ m_0$, where $m_0 = 9.11 \times 10^{-31}$ kg. For instance, the effective mass of the electrons of the oxide semiconductor may be in a range from about $0.221\ m_0$ to about $0.243\ m_0$, such as $0.222\ m_0$.

It is also noted that an oxide semiconductor may exhibit oxygen vacancies, which refer to structural defects caused by oxygen deficiencies in bonds where oxygen elements would otherwise be present. Due to such oxygen vacancies in an oxide semiconductor, the valence electrons of a metal that are supposed to participate in bonding with oxygen may remain as surplus electrons, e.g., electron donors. As such, the electron density in the oxide semiconductor may be increased to increase the conductivity of the electrons. To this end, when the oxygen vacancy-forming energy in an oxide semiconductor is lowered, a larger number of oxygen vacancies may be formed, and the conductivity of the electrons may be increased. It is noted that oxygen vacancy-forming energy may be determined as in Equation 2, provided below.

$$\Delta E(\alpha) = E(\alpha) - E(\text{ideal}) + \mu_O \qquad \text{Equation 2}$$

It is noted that $\Delta E(\alpha)$ is the oxygen vacancy-forming energy, $E(\alpha)$ is the total energy of a unit cell including an oxygen vacancy, $E(\text{ideal})$ is the total energy of a unit cell excluding an oxygen vacancy, and $\mu_O$ is the chemical potential energy of oxygen in a gas phase. A unit cell refers to a minimum lattice unit, e.g., it represents the simplest, smallest shape from which an overall lattice structure is construed. In exemplary embodiments, the oxygen vacancy-forming energy of an oxide semiconductor may be in a range from about 8.5 to about 12.0 eV, such as about 9.0 to about 11.5 eV, e.g., about 9.5 to about 11.0 eV.

According to exemplary embodiments, an oxide semiconductor may be formed as a thin film and utilized as such in any suitable electronic device, such as a thin film transistor, a light-emitting device, a solar cell, an optical recording device, etc. For instance, a thin film of the oxide semiconductor material may be formed using a vacuum process, such as sputtering, pulsed laser deposition (PLD), atomic layer deposition (ALD), metal organic chemical vapor deposition (MOCVD), etc. Additionally or alternatively, the thin film may be formed using a solution process, such as a sol-gel method, a metal organic decomposition (MOD) method, a nanoparticle dispersion solution method, a chemical bath deposition (CBD) method. It is noted, however, that any other suitable fabrication technique may be utilized.

In exemplary embodiments, a thin film transistor including a gate electrode, a gate insulating layer disposed on the gate electrode, a semiconductor layer insulated from the gate electrode via the gate insulating layer, and source and drain electrodes disposed on the semiconductor layer may be formed utilizing the aforementioned oxide semiconductor composition. That is, the semiconductor layer may include an oxide semiconductor including Zn, Sn, and at least one of Ag and Au.

Figure 1:
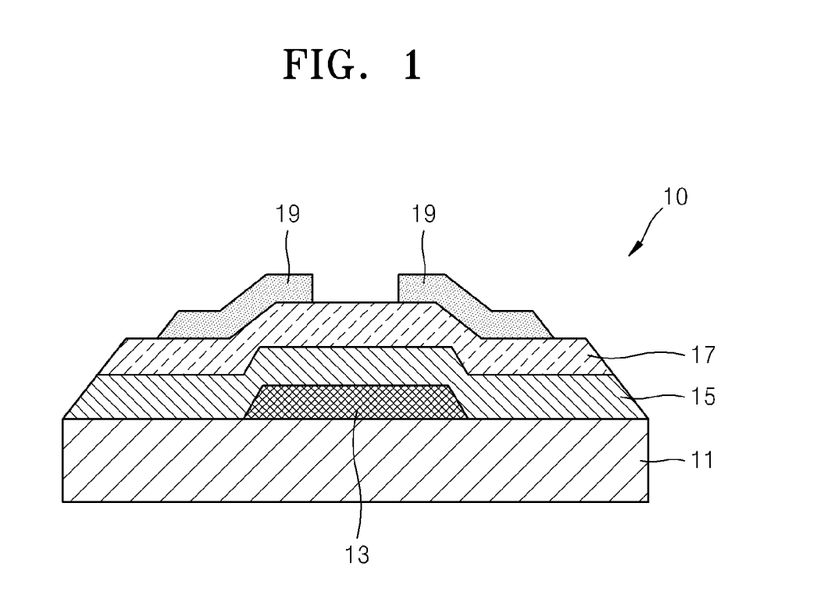
FIG. 1 is a schematic cross-sectional view of an oxide semiconductor thin film transistor, according to exemplary embodiments.

FIG. 1 is a schematic cross-sectional view of an oxide semiconductor thin film transistor, according to exemplary embodiments. Referring to FIG. 1, the oxide semiconductor thin film transistor 10 includes a substrate 11, a gate electrode 13, a gate insulating layer 15, a semiconductor layer 17, and source and drain electrodes 19.

According to exemplary embodiments, the substrate 11 may be formed using any suitable material, such as, for example, a transparent glass including silicon oxide as a main component. It is contemplated, however, that the substrate 11 may include any other suitable material, such as, for example, plastic, silicon, metal, etc., and/or combinations thereof. The substrate 11 may be formed using a flexible plastic film or thin film glass, which may enable the thin film transistor 10 to be bent, folded, rolled, or otherwise manipulated.

To prevent diffusion of impurity ions from the substrate 11 or penetration of moisture, external air, and/or other contaminants to one or more other components of the oxide semiconductor thin film transistor 10, an auxiliary layer (not illustrated), such as a barrier layer, a blocking layer, and/or a buffer layer, may be provided. It is noted that the auxiliary layer may also planarize a surface of the substrate 11. To this end, it is noted that the auxiliary layer may be formed form any suitable material, such as, for example, silicon oxide, silicon nitride, etc.

As seen in FIG. 1, the gate electrode 13 may be formed on the substrate 11. The gate electrode 13 may be formed using any suitable conductive material, such as, for example, a conductive metal material. For instance, the gate electrode 13 may include Ag, magnesium (Mg), aluminum (Al), platinum (Pt), palladium (Pd), Au, nickel (Ni), neodymium (Nd), iridium (Ir), chromium (Cr), lithium (Li), calcium (Ca), molybdenum (Mo), titanium (Ti), tungsten (W), copper (Cu), etc., or an alloy of two or more thereof. It is also contemplated that the gate electrode 13 may include a conductive oxide, such as, for instance, tin oxide, zinc oxide, indium oxide, indium tin oxide (ITO), indium zinc oxide (IZO), gallium zinc oxide (GZO), indium gallium oxide (IGO), aluminum zinc oxide (AZO), etc. To this end, one or more conductive polymers (ICP) may be utilized, such as, for example, polyaniline, poly(3,4-ethylenedioxythiophene) poly(styrenesulfonate) (PEDOT:PSS), etc. It is contemplated, however, that any other suitable material or composition of materials may be utilized.

The gate insulating layer 15 is formed on the gate electrode 13. The gate insulating layer 15 may be formed using any suitable dielectric material or any material for that matter exhibiting a relatively high dielectricity, such as, for example, silicon oxide ($Si_xO_y$), silicon nitride ($Si_xN_y$), silicon oxynitride (SiON), hafnium oxide ($Hf_xO_y$), aluminum oxide ($Al_xO_y$), yttrium oxide ($Y_xO_y$), tantalum oxide ($Ta_xO_y$), etc., or a combination thereof.

According to exemplary embodiments, the semiconductor layer 17 is formed on the gate insulating layer 15. The semiconductor layer 17 may be formed using an oxide semiconductor including Zn, Sn, and at least one of Ag and Au as previously described. That is, the semiconductor layer 17 may be formed using a Zn—Sn—Ag—O, Zn—Sn—Au—O, or Zn—Sn—Ag—Au—O semiconductor. In this manner, the atomic ratio of element M with respect to all the elements (e.g., Zn+Sn+M) of the oxide semiconductor, e.g., M/(Zn+Sn+M), may be in a range from about 1 to about 16 at %, e.g., in a range from about 1 to about 4 at %, such as, for example, about 2 to about 5 at %. In exemplary embodiments, the atomic ratio of Zn to Sn (e.g., Zn:Sn) may be in a range from about 1:1 to about 2:1. In addition, the atomic ratio of oxygen to Sn (e.g., O:Sn) may be in a range from about 4:1 to about 3.75:1. The electron mobility of the Zn—Sn—Ag—O, the Zn—Sn—Au—O, or the Zn—Sn—Ag—Au—O semiconductor may be in a range from about 9 to about 10 cm$^2$/V·s, such as about 9.3 to about 9.7 cm$^2$/V·s, e.g., about 9.4 to about 9.6 cm$^2$/V·s. Further, the effective mass of the electrons of the oxide semiconductor may be in a range from about 0.220 m$_0$ to about 0.224 m$_0$, e.g., about 0.221 m$_0$ to about 0.243 m$_0$, such as 0.222 m$_0$.

The source electrode and the drain electrode 19 are formed on the semiconductor layer 17. The source electrode and the drain electrode 19 may be formed using any suitable conductive material, such as any suitable conductive metal material. For instance, the source electrode and the drain electrode 19 may be formed of Ag, Mg, Al, Pt, Pd, Au, Ni, Nd, Ir, Cr, Li, Ca, Mo, Ti, W, Cu, etc., or an alloy of two or more thereof. It is also contemplated that the source electrode and the drain electrode 19 may include a conductive oxide, such as tin oxide, zinc oxide, indium oxide, ITO, IZO, GZO, IGO, AZO, etc. To this end, one or more conductive polymers (ICP) may be utilized, such as, for example, polyaniline, poly(3,4-ethylenedioxythiophene) poly(styrenesulfonate) (PEDOT: PSS), etc. It is contemplated, however, that any other suitable material or composition of materials may be utilized. To this end, the source electrode and the drain electrode 19 may be formed from the same or different material as the gate electrode 13.

Figure 2:
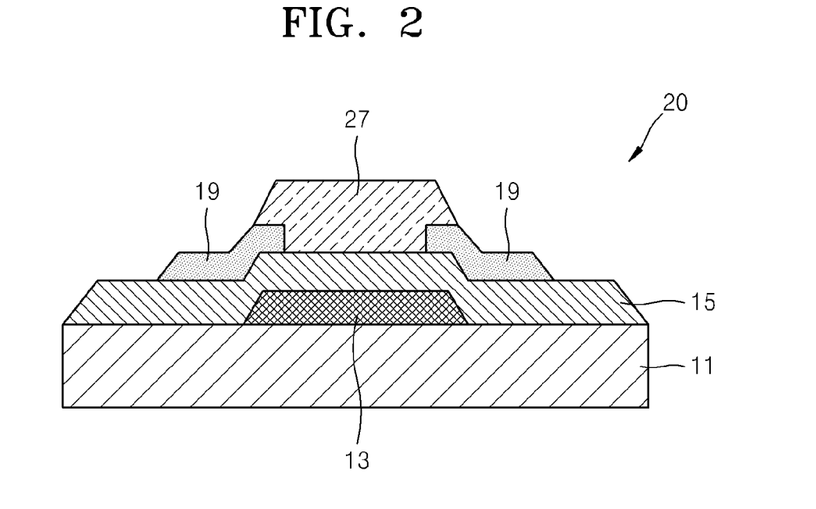
FIG. 2 is a schematic cross-sectional view of an oxide semiconductor thin film transistor, according to exemplary embodiments.

FIG. 2 is a schematic cross-sectional view of an oxide semiconductor thin film transistor, according to exemplary embodiments. Referring to FIG. 2, the oxide semiconductor thin film transistor 20 has substantially the same constitution as the oxide semiconductor thin film transistor 10 of FIG. 1 except for the disposition of the source electrode and the drain electrode 19 and the semiconductor layer 27. To avoid obscuring exemplary embodiments described herein, primarily differences are provided below.

As seen in FIG. 2, the source electrode and the drain electrode 19 are disposed on the gate insulating layer 15. To this end, the semiconductor layer 27 may also be disposed on the gate insulating layer 15 with at least respective portions of the source electrode and the drain electrode 19 disposed between the semiconductor layer 27 and the gate insulating layer 15.

Figure 3:
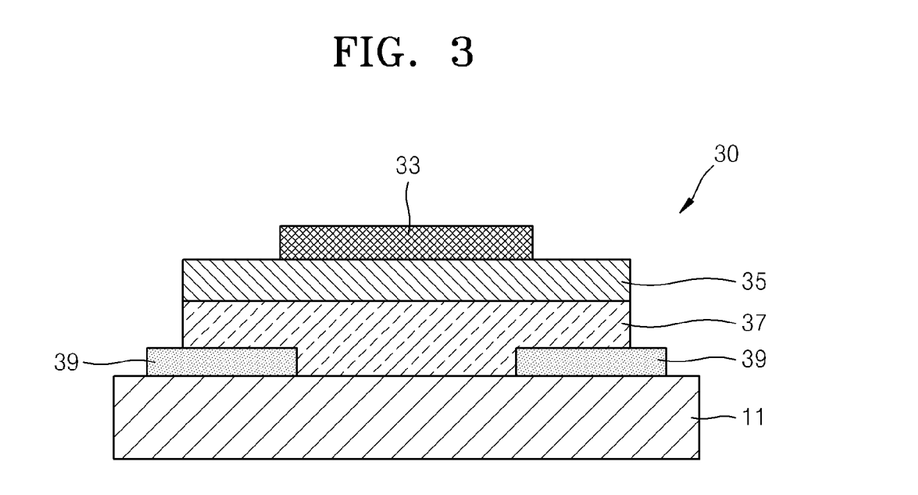
FIG. 3 is a schematic cross-sectional view of an oxide semiconductor thin film transistor, according to exemplary embodiments.

FIG. 3 is a schematic cross-sectional view of an oxide semiconductor thin film transistor, according to exemplary embodiments. The oxide semiconductor thin film transistor 30 of FIG. 3 is substantially similar to the oxide semiconductor thin film transistor 10 of FIG. 1 except for the disposition of the various components, as will be described in more detail. As such, to avoid obscuring exemplary embodiments described herein, primarily differences are provided below.

Referring to FIG. 3, the thin film transistor 30 includes substrate 11, source and drain electrodes 39 disposed on the substrate 11, a semiconductor layer 37 disposed on the source and drain electrodes 39, a gate insulating layer 35 disposed on the semiconductor layer 37, and a gate electrode 33 disposed on the gate insulating layer 35. The materials of the substrate 11, gate electrode 33, the gate insulating layer 35, the semiconductor layer 37, and the source electrode and the drain electrode 39 are the same as the substrate 10, the gate electrode 13, the gate insulating layer 15, the semiconductor layer 17, and the source electrode and the drain electrode 19, respectively, as described in association with FIG. 1.

Figure 4:
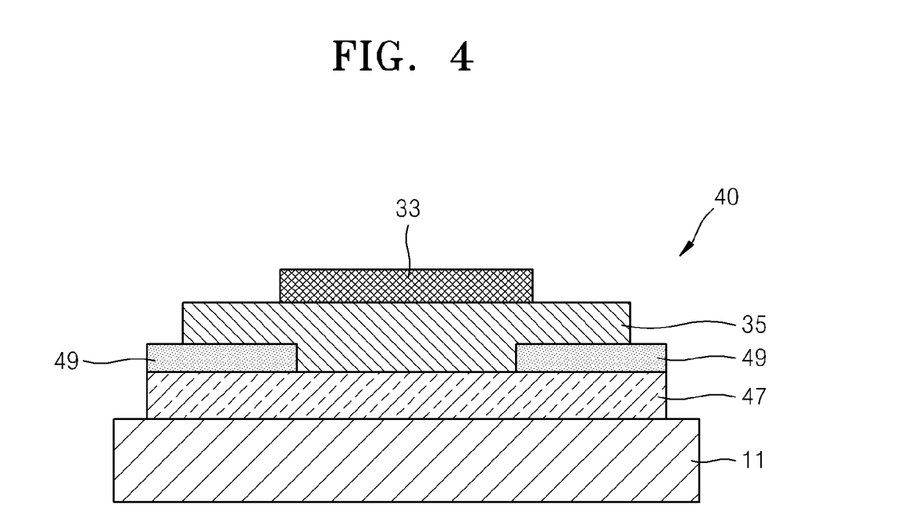
FIG. 4 is a schematic cross-sectional view of an oxide semiconductor thin film transistor, according to exemplary embodiments.

FIG. 4 is a schematic cross-sectional view of an oxide semiconductor thin film transistor, according to exemplary embodiments. Referring to FIG. 4, the oxide semiconductor thin film transistor 40 has substantially the same constitution as the oxide semiconductor thin film transistor 30 of FIG. 3 except for the disposition of the source and drain electrodes 49. To avoid obscuring exemplary embodiments described herein, primarily differences are provided below.

As seen in FIG. 4, the source electrode and the drain electrode 49 are disposed on the semiconductor layer 47. To this end, the gate insulating layer 35 may also be disposed on the semiconductor layer 47 with at least respective portions of the source electrode and the drain electrode 49 disposed between the gate insulating layer 35 and the semiconductor layer 47.

According to exemplary embodiments, the oxide semiconductor thin film transistors 10 and 20 of FIGS. 1 and 2 are "bottom" gate structure oxide semiconductor thin film transistors with the gate electrode 13 disposed under the semiconductor layer 17 or 27. In this manner, the oxide semiconductor thin film transistors 30 and 40 of FIGS. 3 and 4 are "top" gate structure oxide semiconductor thin film transistors with the gate electrode 33 disposed on the semiconductor layer 37 or 47. It is contemplated, however, that exemplary embodiments may be implemented in association with any other suitable oxide semiconductor thin film transistor. To this end, it is noted that exemplary embodiments may be used in association with, for instance, switching transistors and/or driving transistors in a display device, such as a light emitting diode (LED) display device, an organic light emitting diode (OLED) display device, a plasma display panel (PDP) display device, a field emission display (FED) device, an electrophoretic display (EPD) device, an electrowetting display (EWD), etc. It is also contemplated that exemplary embodiments may be utilized in association with any other suitable electronic device.

Simulation on Zn—Sn—Ag—O and Zn—Sn—Au—O Semiconductors

Simulations on exemplary Zn—Sn—Ag—O and Zn—Sn—Au—O semiconductors were conducted on an atomic scale using Vienna Ab initio Simulation Package (VASP). In the VASP simulations, the characteristics of molecules having a plurality of atoms were simulated through an electronic structure calculation.

Figure 5:
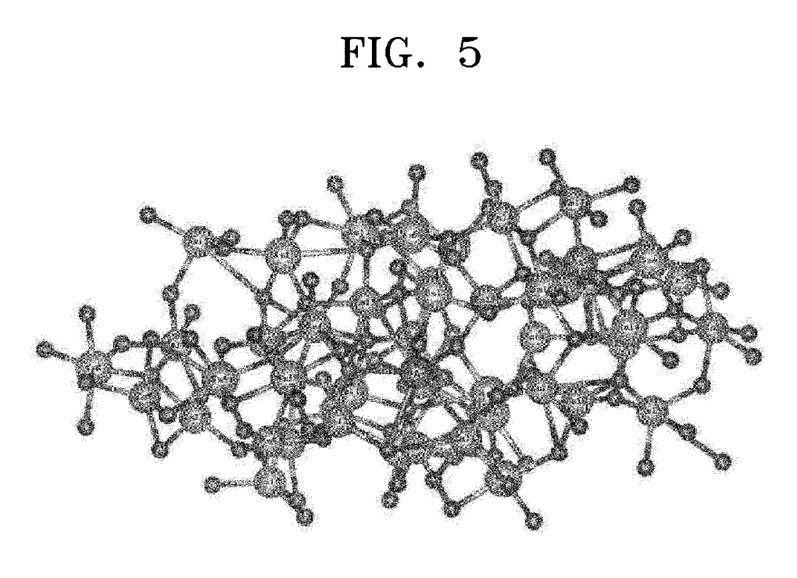
FIG. 5 schematically illustrates the molecular structure of a simulated Zn—Sn—Ag—O composition, according to exemplary embodiments.
Figure 6:
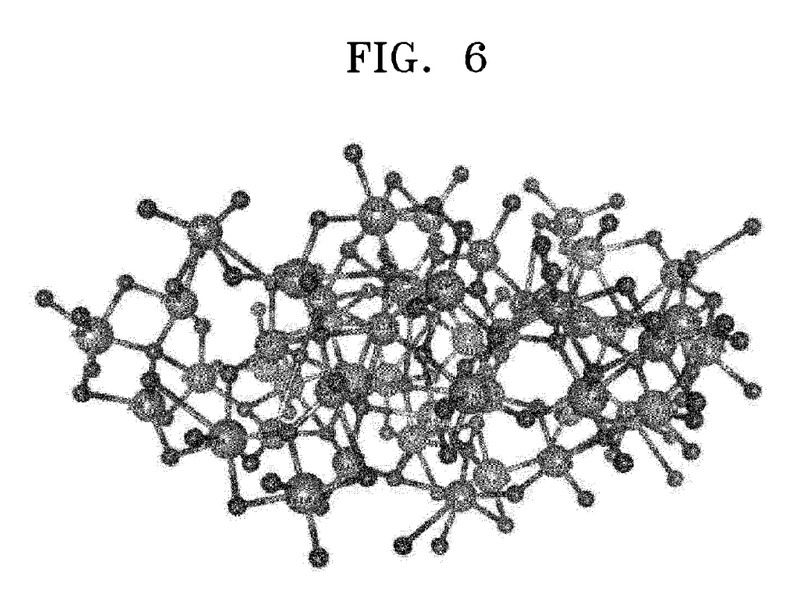
FIG. 6 schematically illustrates the molecular structure of a simulated Zn—Sn—Au—O composition, according to exemplary embodiments.

In these simulations, a unit cell was defined, and the unit cell was repeated. The unit cell refers to the minimum lattice unit for the atomic scale simulation. The Zn—Sn—Ag—O and the Zn—Sn—Au—O oxide semiconductors were simulated as an amorphous structure. In the Zn—Sn—Ag—O and the Zn—Sn—Au—O oxide semiconductors, the number of Sn atoms was 16, the number of O atoms was 63, the sum of the number of Zn atoms and the number of Ag atoms or the sum of the number of Zn atoms and the number of Au atoms was 32 in the unit cell. As such, the ratio of Zn:Sn was about 2:1. FIG. 5 schematically illustrates the molecular structure of a simulated Zn—Sn—Ag—O composition, according to exemplary embodiments. FIG. 6 schematically illustrates the molecular structure of a simulated Zn—Sn—Au—O composition, according to exemplary embodiments. The Zn—Sn—Ag—O and the Zn—Sn—Au—O semiconductors in FIGS. 5 and 6 correspond to oxide semiconductors with unit cells including 2 Ag atoms and 2 Au atoms, respectively.

Figure 7:
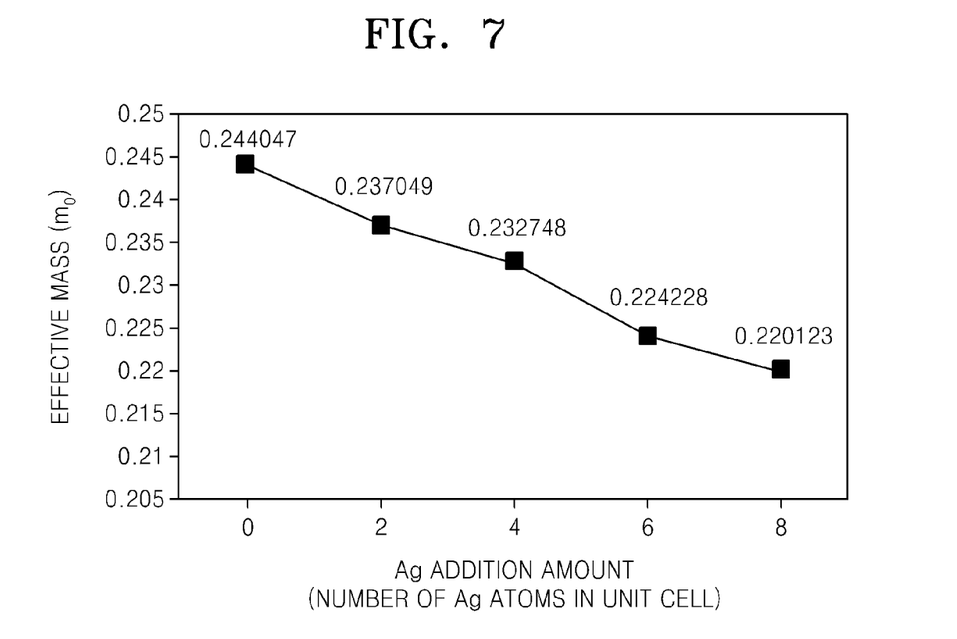
FIG. 7 is a graph comparing effective mass of electrons in a Zn—Sn—Ag—O semiconductor with the number of Ag atoms in a unit cell, according to exemplary embodiments.

FIG. 7 is a graph comparing effective mass of electrons in a Zn—Sn—Ag—O semiconductor with the number of Ag atoms in a unit cell, according to exemplary embodiments.

Referring to FIG. 7, as the number of Ag atoms in the unit cell increases, the effective mass of the electrons of the Zn—Sn—Ag—O semiconductor decreases. In the graph in FIG. 7, the unit of the effective mass of the electrons is the rest mass $m_0$ of the electrons, and the rest mass $m_0$ of the electron is about $9.11 \times 10^{-31}$ kg. As described above, since the effective mass of the electrons is inversely proportional to the electron mobility, the electron mobility of the Zn—Sn—Ag—O semiconductor may be increased as the number of atoms or the amount of Ag increases.

Figure 8:
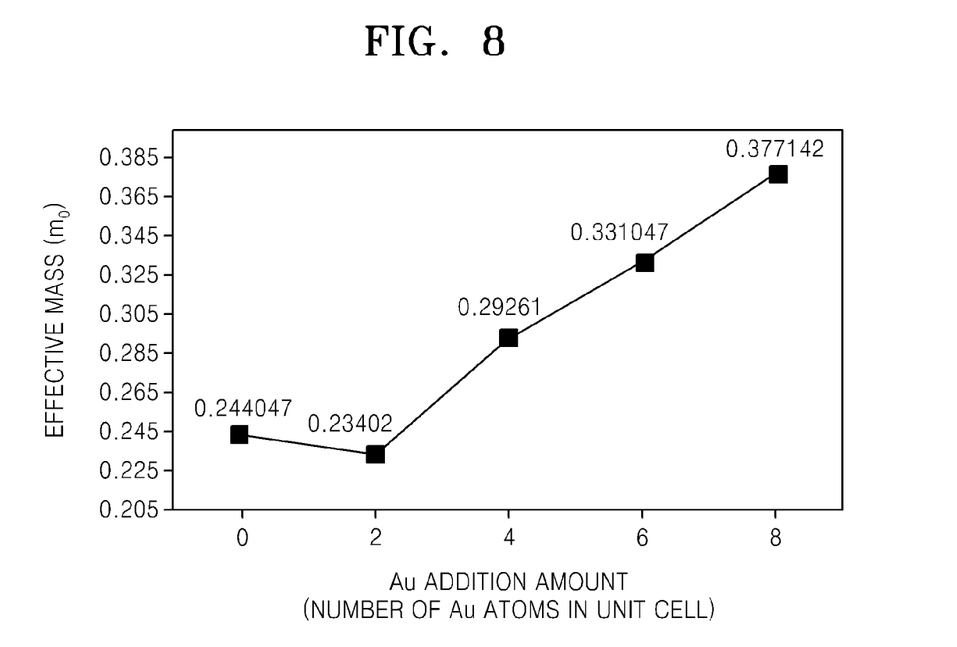
FIG. 8 is a graph comparing effective mass of electrons in a Zn—Sn—Au—O semiconductor with the number of Au atoms in a unit cell, according to exemplary embodiments.

FIG. 8 is a graph comparing effective mass of electrons of a Zn—Sn—Au—O semiconductor with the number of Au atoms in a unit cell, according to exemplary embodiments. Referring to FIG. 8, as the number of Au atoms in the unit cell increases, the effective mass of the electrons of the Zn—Sn—Au—O semiconductor may decrease to a first number of Au atoms, but increase thereafter. As such, as the number of atoms or the amount of Au increases, the electron mobility of the Zn—Sn—Au—O semiconductor may increase to a certain number of Au atoms and decreased thereafter.

Figure 9:
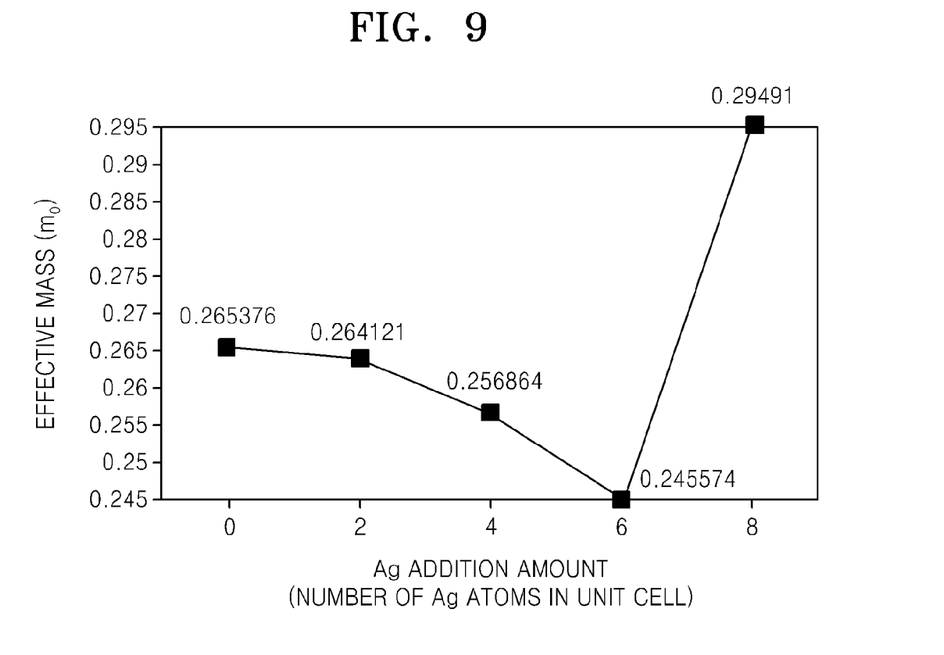
FIG. 9 is a graph comparing effective mass of electrons in an In—Ga—Zn—Ag—O semiconductor with the number of Ag atoms in a unit cell, according to exemplary embodiments.

FIG. 9 is a graph comparing effective mass of electrons of an In—Ga—Zn—Ag—O semiconductor with the number of Ag atoms in a unit cell, according to exemplary embodiments. Referring to FIG. 9, as the number of Ag atoms in the unit cell increases, the effective mass of the electrons of the In—Ga—Zn—Ag—O semiconductor may decrease to a first number of Ag atoms and increase thereafter. Thus, as the number of atoms or the addition amount of Ag increases, the electron mobility of the In—Ga—Zn—Ag—O semiconductor may increase to a first number of Ag atoms and decrease thereafter.

Figure 10:
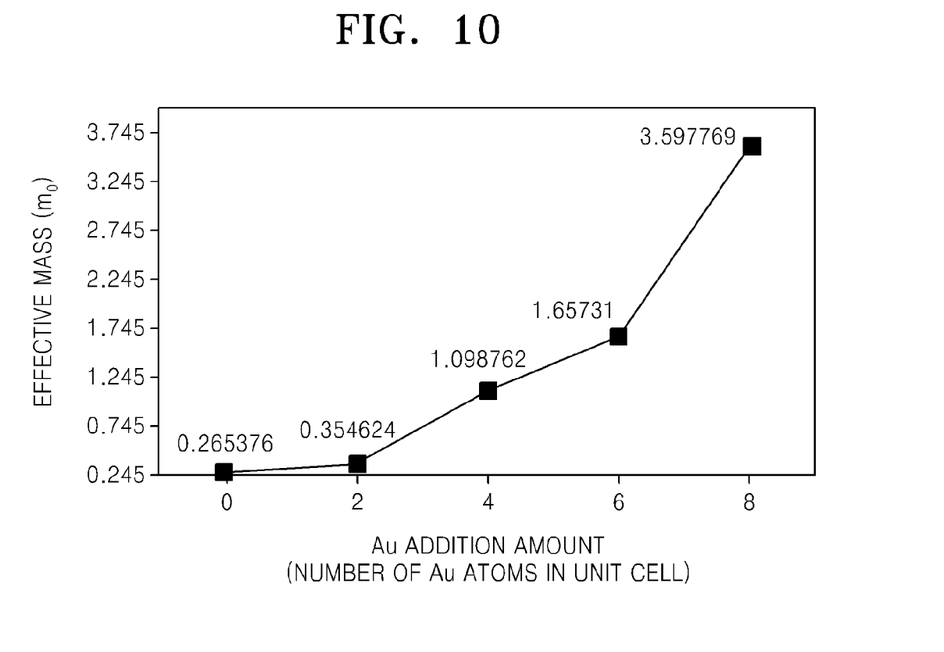
FIG. 10 is a graph comparing effective mass of electrons in an In—Ga—Zn—Au—O semiconductor with the number of Au atoms in a unit cell, according to exemplary embodiments.

FIG. 10 is a graph comparing effective mass of electrons of an In—Ga—Zn—Au—O semiconductor with the number of Au atoms in a unit cell, according to exemplary embodiments. Referring to FIG. 10, as the number of Au atoms in the unit cell increases, the effective mass of the electrons in the In—Ga—Zn—Au—O semiconductor may increase. As such, as the number of atoms or the amount of Au increases, the electron mobility of the In—Ga—Zn—Au—O oxide semiconductor may decrease.

When comparing the graphs provided in FIGS. 7 and 9, the electron mobility of the Zn—Sn—Ag—O semiconductor may be higher than the electron mobility of the In—Ga—Zn—Au—O semiconductor. In addition, when comparing the graphs provided in FIGS. 8 and 10, the electron mobility of the Zn—Sn—Au—O oxide semiconductor may be higher than that of the In—Ga—Zn—Au—O semiconductor.

Figure 11:
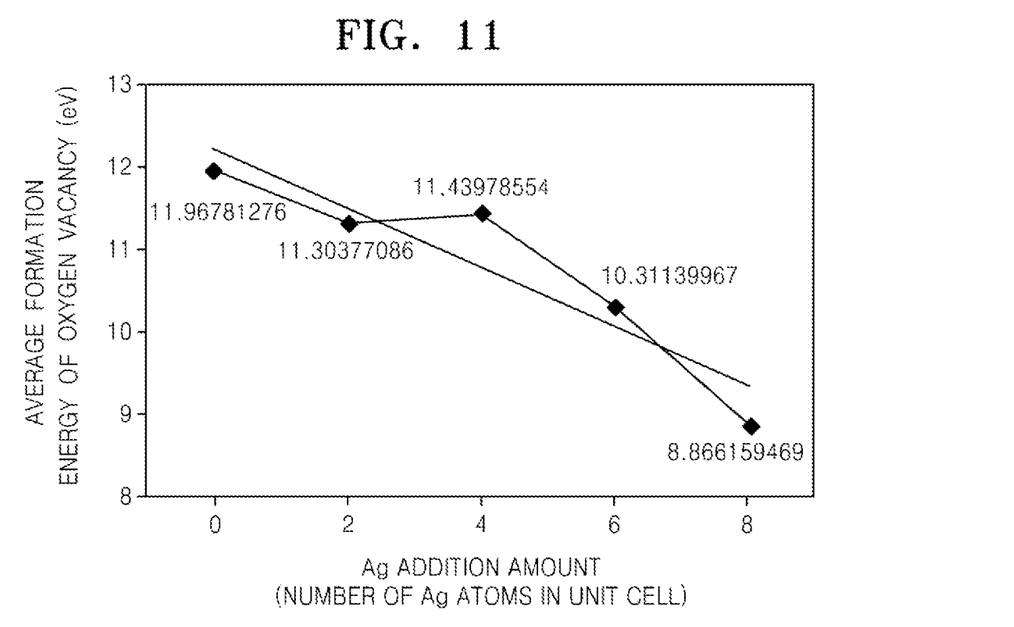
FIG. 11 is a graph comparing average formation energy of oxygen vacancy in a Zn—Sn—Ag—O semiconductor with the number of Ag atoms in a unit cell, according to exemplary embodiments.
Figure 12:
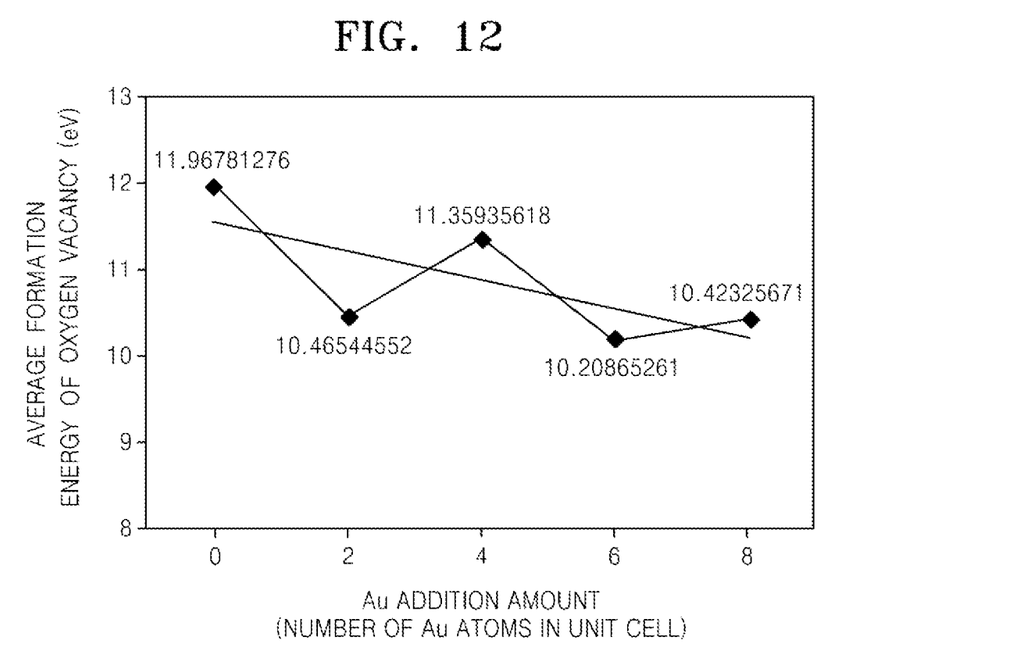
FIG. 12 is a graph comparing average formation energy of oxygen vacancy in a Zn—Sn—Au—O semiconductor with the number of Au atoms in a unit cell, according to exemplary embodiments.

FIG. 11 is a graph comparing average formation energy of oxygen vacancy in a Zn—Sn—Ag—O semiconductor with the number of Ag atoms in a unit cell, according to exemplary embodiments. FIG. 12 is a graph comparing average formation energy of oxygen vacancy in a Zn—Sn—Ag—O oxide semiconductor with the number of Au atoms in a unit cell, according to exemplary embodiments.

Referring to FIGS. 11 and 12, as the number of Ag atoms or Au atoms in the unit cell increases, the average oxygen vacancy-forming energy of the Zn—Sn—Ag—O or Zn—Sn—Au—O semiconductor may decrease. It is noted that the average formation energy of oxygen vacancy in the oxide semiconductor including Ag may be further decreased as compared to the oxide semiconductor including Au. As described above, when the formation energy of oxygen vacancy in an oxide semiconductor is lowered, a larger number of oxygen vacancies may be formed. A larger number of oxygen vacancies enables the electrons to move more freely. As such, the conductivity of the Zn—Sn—Ag—O and Zn—Sn—Au—O oxide semiconductors may increase in inverse proportion to the graphs shown in FIGS. 11 and 12.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An oxide semiconductor, comprising:
   zinc (Zn);
   tin (Sn); and
   at least one element (M) among Ag and Au,
   wherein an effective mass of electrons is in a range from about 0.220 $m_0$ to about 0.244 $m_0$ ($m_0$=9.11×10$^{-31}$ kg).

2. The oxide semiconductor of claim 1, wherein an atomic ratio of M/(Zn+Sn+M) is in a range from about 1 to about 16 atomic percent.

3. The oxide semiconductor of claim 1, wherein an atomic ratio of Zn to Sn (Zn:Sn) is in a range from about 1:1 to about 2:1.

4. The oxide semiconductor of claim 1, wherein a formation energy of oxygen vacancy is in a range from about 8.5 to about 12.0 eV.

5. The oxide semiconductor of claim 1, wherein the oxide semiconductor is an n-type semiconductor.

6. The oxide semiconductor of claim 1, wherein the element (M) is Ag.

7. The oxide semiconductor of claim 1, wherein the element (M) is Au.

8. A thin film, comprising:
   zinc (Zn);
   tin (Sn); and
   at least one element (M) among Ag and Au,
   wherein an effective mass of electrons is in a range from about 0.220 $m_0$ to about 0.244 $m_0$ ($m_0$=9.11×10$^{-31}$ kg).

9. A thin film transistor, comprising:
   a gate electrode disposed on a substrate;
   a gate insulating layer disposed on the substrate;
   a semiconductor layer disposed on the substrate, the gate insulating layer being configured to insulate the semiconductor layer and the gate electrode from one another;
   a source electrode disposed on the substrate; and
   a drain electrode disposed on the substrate, wherein the semiconductor layer comprises:
   zinc (Zn);
   tin (Sn); and
   at least one element (M) among Ag and Au, and
   wherein an effective mass of electrons in the semiconductor layer is in a range from about 0.220 $m_0$ to about 0.244 $m_0$ ($m_0$=9.11×10$^{-31}$ kg).

10. The thin film transistor of claim 9, wherein the semiconductor layer is disposed on the gate electrode.

11. The thin film transistor of claim 9, wherein the gate electrode is disposed on the semiconductor layer.

12. The thin film transistor of claim 9, wherein the source electrode and the drain electrode are disposed on the semiconductor layer.

13. The thin film transistor of claim 9, wherein the semiconductor layer is disposed on at least respective portions of the source electrode and the drain electrode.

14. The thin film transistor of claim 9, wherein an atomic ratio of M/(Zn+Sn+M) is in a range from about 1 to about 16 atomic percent.

15. The thin film transistor of claim 9, wherein an atomic ratio of Zn to Sn (Zn:Sn) is in a range from about 1:1 to about 2:1.

16. The thin film transistor of claim 9, wherein the semiconductor layer is an n-type semiconductor layer.

17. The thin film transistor of claim 9, wherein the element (M) is Ag.

18. The thin film transistor of claim 9, wherein the element (M) is Au.

19. The thin film of claim 8, wherein an atomic ratio of M/(Zn+Sn+M) is in a range from about 1 to about 16 atomic percent.

20. The thin film of claim 8, wherein an atomic ratio of Zn to Sn (Zn:Sn) is in a range from about 1:1 to about 2:1.

21. The thin film of claim 8, wherein a formation energy of oxygen vacancy is in a range from about 8.5 to about 12.0 eV.

22. The thin film of claim 8, wherein the element (M) is Ag.

23. The thin film of claim 8, wherein the element (M) is Au.

* * * * *